US007514931B1

(12) United States Patent
Shimotomai et al.

(10) Patent No.: US 7,514,931 B1
(45) Date of Patent: Apr. 7, 2009

(54) SOLAR SIMULATOR AND METHOD FOR DRIVING THE SAME

(75) Inventors: Mitsuhiro Shimotomai, Okazaki (JP); Yoshihiro Shinohara, Okazaki (JP); Katsumi Irie, Okazaki (JP)

(73) Assignee: Nisshinbo Industries, Inc., Tokyo (JP)

( * ) Notice: Subject to any disclaimer, the term of this patent is extended or adjusted under 35 U.S.C. 154(b) by 141 days.

(21) Appl. No.: 11/528,437

(22) Filed: Sep. 28, 2006

(30) Foreign Application Priority Data

Oct. 3, 2005 (JP) ............................ 2005-290185
Aug. 21, 2006 (JP) ............................ 2006-224416

(51) Int. Cl.
*G01R 31/00* (2006.01)
*H05B 37/00* (2006.01)
*H05B 39/00* (2006.01)
*G01J 3/28* (2006.01)

(52) U.S. Cl. ...................... 324/403; 315/174; 315/160; 356/300; 356/326

(58) Field of Classification Search ...................... None
See application file for complete search history.

(56) References Cited

U.S. PATENT DOCUMENTS 4,641,227 A * 2/1987 Kusuhara .................... 362/231
5,548,189 A * 8/1996 Williams .................... 315/224
6,154,034 A * 11/2000 Lovelady et al. ............ 324/501
2002/0130626 A1* 9/2002 Okamoto et al. ............ 315/219
2002/0139928 A1* 10/2002 Rathod et al. ............ 250/252.1
2002/0163315 A1* 11/2002 Kaneko et al. .............. 315/246
2002/0180973 A1* 12/2002 MacKinnon et al. ........ 356/425
2004/0020529 A1 2/2004 Schutt et al.

FOREIGN PATENT DOCUMENTS

EP 0-183-921 A2 6/1986
GB 1-340-430 12/1973
JP A-62-237338 10/1987
JP B2-06-105280 12/1994
JP A- 2006-108128 4/2006

* cited by examiner

*Primary Examiner*—Vincent Q Nguyen
*Assistant Examiner*—Jeff Natalini
(74) *Attorney, Agent, or Firm*—Oliff & Berridge, PLC

(57) ABSTRACT

To provide a solar simulator which has a plurality of xenon arc lamps as a light source, in which a predetermined amount of light is stably obtained from each of the xenon arc lamps so that constant irradiance over a test plane is ensured. The solar simulator comprises a plurality of xenon arc lamps; a plurality of light amount sensors provided one for each of the xenon arc lamps; and a plurality of control circuits provided one for each of the xenon arc lamps, for controlling a current flowing through, or a voltage applied to, each of the xenon arc lamps, wherein a detection signal output from each of the light amount sensors is fed back to each of the control circuits to control the relevant control circuit, to thereby control the amount of light emitted from each of the xenon arc lamps.

7 Claims, 6 Drawing Sheets

SOLAR SIMULATOR AND METHOD FOR DRIVING THE SAME

BACKGROUND OF THE INVENTION

1. Field of the Invention

The present invention relates to a solar simulator and a method for driving the same. In particular, the present invention relates to a solar simulator for generating light from a xenon arc lamp, which is preferable in measurement of the output characteristic of photovoltaic devices, as pseudo sunlight, and also to a method for driving such a solar simulator.

2. Description of the Related Art

As the importance of photovoltaic devices as clean energy is being widely recognized, the demand for such devices is increasing. The demand is coming from a variety of fields, from power energy supplies for large-scale machines to small-scale power supplies for precise electronic machines.

Here, in order for photovoltaic devices to be widely used in a variety of fields, accurate measurement of the characteristics, in particular, the output characteristic, of the photovoltaic devices is necessary, as many problems would otherwise be expected to arise where the photovoltaic devices is used. Therefore, conventionally, a solar simulator for measuring the output characteristic of photovoltaic devices has been proposed, and actually used (see Japanese Patent Publication No. Hei 6-105280).

When the output characteristic of photovoltaic devices is measured using such a solar simulator, in particular, when the output characteristic of large-scaled photovoltaic devices having the size (the area of an test plane) of 1 m×1 m or larger is measured, for example, it is necessary to use a solar simulator having a plurality of xenon arc lamps arranged therein. That is, where the amount of light emitted from a single xenon arc lamp presents the irradiance distribution schematically shown in FIG. 9, it is necessary to ensure uniform illumination over the test plane of the solar simulator used in the measurement by using a plurality of xenon arc lamps.

In addition, there are a variety of shapes (external shape) available, including a shape that is long in the lateral direction, as the shape of large-scaled photovoltaic devices, and with respect to large-scale photovoltaic devices having the size of 1 m×4 m, for example, a solar simulator having two xenon arc lamps each about 2,000 mm long arranged therein is used for the measurement of the output characteristic thereof.

In FIG. 9, XL refers to a xenon arc lamp, Lx and Ly refer to the waveforms indicative of the light amount along the x-axis and the y-axis, respectively, and Sb refers to photovoltaic devices to be measured.

However, a solar simulator having a plurality of xenon arc lamps as a light source suffers from a problem that an expected amount of light is not readily and stably obtained from each xenon arc lamp and therefore uniform irradiance over the test plane is not readily ensured.

As for the light emission circuit of a conventional solar simulator which has xenon lamps as a light source, when the solar simulator is constructed having a plurality of xenon lamps to produce light emission therefrom, a problem is expected in that the entire structure is resultantly enlarged as such a light emission circuit (in particular, a power supply device contained therein) is provided for each lamp and therefore a large space within the solar simulator is occupied by the light emission circuits.

Provision of an individual light emission circuit for each lamp leads to another problem that uniform irradiance is not readily ensured over the test plane relative to large-scale photovoltaic devices as the amount of light irradiated from each of the lamps may vary as time passes.

Here, a capacitor used as a power supply of a solar simulator in which a single light emission circuit is used to produce light emission from a single lamp is required to have comparable withstand voltage and a commercially available typical capacitor having such a withstand voltage is of a few μF to a few tens of μF. Therefore, when such a commercially available capacitor is used, the produced light emission can last at most for about 1 millisecond.

Moreover, as the amount of light emitted from the xenon arc lamp may vary when the capacitor discharges, depending on the voltage variation according to the discharge curve of the capacitor, this also makes it difficult to stably obtain a constant amount of light. In actual fact, in measurement of the output characteristic of photovoltaic devices, light emission is attempted from a few tens of times to about one hundred and thirty times for a single photovoltaic devices to be measured.

Therefore, in such a situation, it is more difficult, or sometimes even impossible using a conventional technique, to ensure uniform irradiance when the output characteristic of large-scale photovoltaic devices is measured while producing light emission from a plurality of lamps.

In measurement of the output characteristic of photovoltaic devices which is slow in response, light emission is required to be continued for from a few hundred microseconds to a few seconds. A light emission circuit capable of such prolonged light emission is constructed having a main discharge voltage supply prepared in the form of a large-scale high capacity power supply.

Here, suppose that the light source lamp is a xenon arc lamp in which discharge electrodes are situated apart from each other by a distance of about 1000 mm, for example, an electrical potential of about 2000 V to 3000 V is required, and a current of about 30 A flows in the main discharge. A power supply which meets the specifications of this high electrical potential and current is a large-scale power supply of about 60 KW to 90 KW.

Therefore, a conventional light emission circuit capable of measuring the output characteristic of large-scale photovoltaic devices, which requires light emission from a plurality of lamps, inevitably has a large-scale power supply device. As a result, the solar simulator is resultantly enlarged with related device cost accordingly increased.

SUMMARY OF THE INVENTION

The present invention has been conceived in view of the above-described various problems of a conventional solar simulator, and aims to provide a solar simulator having a plurality of xenon arc lamps as a light source, in which an expected amount of light is stably obtained from each of the xenon arc lamps so that uniform irradiance is ensured over the test plane.

Another object of the present invention is to provide a solar simulator capable of stable long-pulse light emission produced from one or more xenon arc lamps without enlarging the device.

Still another object of the present invention is to provide a solar simulator capable of measuring the output characteristic of large-scale photovoltaic devices (for example, 1 m×1 m or over) while lighting a plurality of lamps using a small-scale power supply, without causing irregularity in irradiance over the test plane, and also capable of presenting innovative capability for enhancing measurement accuracy.

In order to solve the above described problems, according to one aspect of the present invention, there is provided a solar simulator, comprising: a plurality of xenon arc lamps; a plurality of light amount sensors provided on the basis of one for each of the xenon arc lamps; and a plurality of control circuits provided on the basis of one for each of the xenon arc lamps, for controlling a current flowing through, or a voltage applied to, each of the xenon arc lamps, wherein a detection signal output from each of the light amount sensors is fed back to each of the control circuits to control the relevant control circuit, to thereby control an amount of light emitted from each of the xenon arc lamps.

In the above, the detection signal output from each of the light amount sensors may be weighted and combined before being fed to each of the control circuits.

According to another aspect of the present invention, there is provided a solar simulator having a light emission circuit for concurrently or selectively lighting one or more xenon arc lamps, wherein the light emission circuit comprises a first power supply for applying electrical potential to destroy an electrically insulated state held between electrodes of each of the xenon arc lamps, a second power supply for applying electrical potential to trigger main discharge after application of the electrical potential to destroy the electrically insulated state held between electrodes of each of the xenon arc lamps, and a third power supply for maintaining the electrical potential required based on electrical resistance within a tube inside each of the xenon arc lamps and a current for main discharge, after the main discharge begins, and further maintaining the current of the main discharge.

Here, the third power supply may include a stabilizing power supply. Also, the third power supply may include a capacitor which is charged by the stabilizing power supply.

Also, a light amount sensor may be provided for each of the one or more xenon arc lamps, and a detection signal output from each of the light amount sensors may be fed back to a current control circuit or a voltage control circuit provided one for each of the xenon arc lamps to control the control circuit, whereby an amount of light emitted from each of the xenon arc lamps is controlled.

In the above, the detection signal output from each of the light amount sensors may be weighted and combined before being fed to each of the control circuits.

According to still another aspect of the present invention, there is provided a method for driving a solar simulator, comprising controlling light emission produced from each of a plurality of xenon lamps of a plurality of solar simulators each having at least one xenon lamp, the light emission being produced using a power supply circuit comprising the second power supply and the third power supply selected from the power supplies described above, to thereby drive the plurality of solar simulators.

In order to measure the output characteristic of large-scale photovoltaic devices having an external size of 1 m×1 m or larger, for example, a solar simulator to be used in the measurement needs to have a structure in which a plurality of xenon arc lamps are provided.

According to the present invention, in this case, a light amount sensor is provided for each of the lamps, so that a detection signal output from each of the light amount sensors is fed to each of the current or voltage control circuits provided for each of the lamps, to thereby control the control circuit. This makes it possible to stabilize the amount of light emitted from each of the lamps. It is therefore possible to realize uniform irradiance over the irradiation surface of the photovoltaic devices to be measured, and therefore highly accurate measurement.

In addition, light emission from the xenon arc lamp is produced using a power supply circuit which comprises the second power supply and the third power supply. This enables stable long-pulse light emission from one or more xenon arc lamps, without enlarging the device.

In particular, as the light emission circuit to light the plurality of xenon arc lamps is constructed having the above-described structure, the power supply itself can be prepared for lower cost as use of a single power supply unit is sufficient. Moreover, such a structure enjoys the benefit of size reduction, as well as remarkable size reduction of the solar simulator for measuring the output characteristic of large-scale photovoltaic devices, compared to the case where a light emission circuit having a conventional structure is used.

In addition, according to the present invention, a plurality of xenon arc lamps are lit using a single power supply circuit which is constructed comprising the second power supply and the third power supply. This can realize a manner of measurement in which the plurality of solar simulators are driven using a single power supply circuit.

Therefore, as the photovoltaic devices is mass-produced, reduction of an area required for installation and simplification of power feeding equipment are attained, compared to a case where a plurality of solar simulators are installed.

DESCRIPTION OF THE PREFERRED EMBODIMENTS

In the following, an exemplary embodiment according to the present invention will be described while referring to the accompanied drawings.

Figure 1:
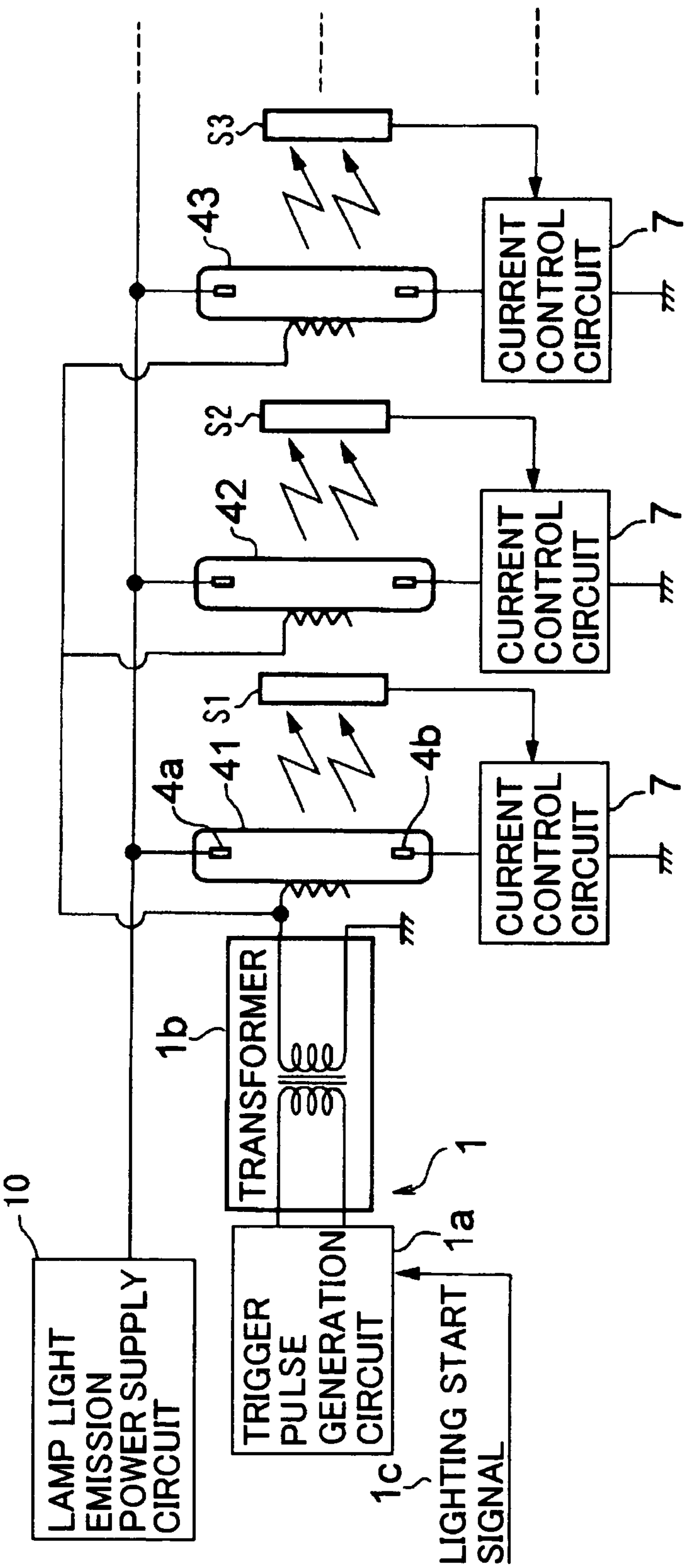
FIG. 1 is a block diagram explaining an embodiment 1 of a light emission circuit of a solar simulator according to the present invention.
Figure 3:
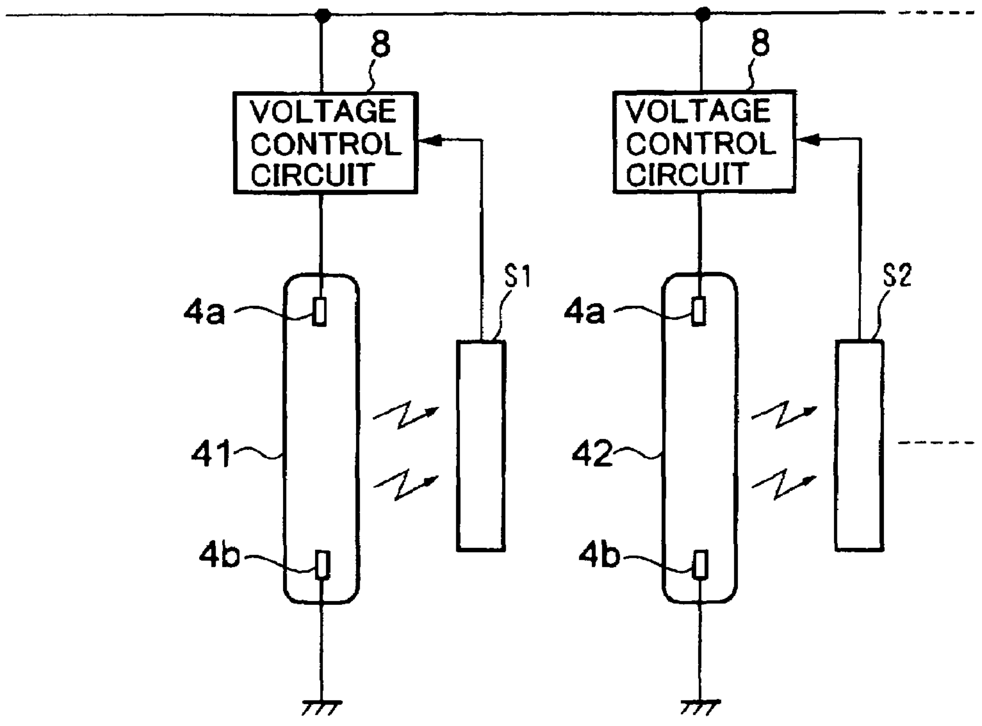
FIG. 3 is a block diagram showing a major element to explain an embodiment 2 of the light emission circuit of the solar simulator according to the present invention.
Figure 4:
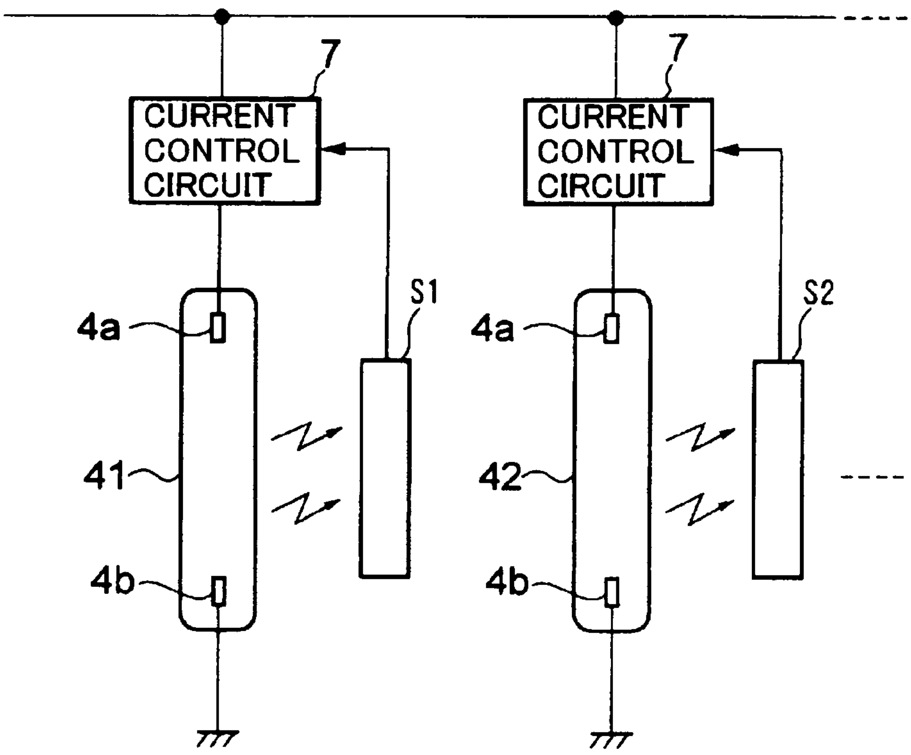
FIG. 4 is a block diagram showing a major element to explain an embodiment 3 of the light emission circuit of the solar simulator according to the present invention.
Figure 5:
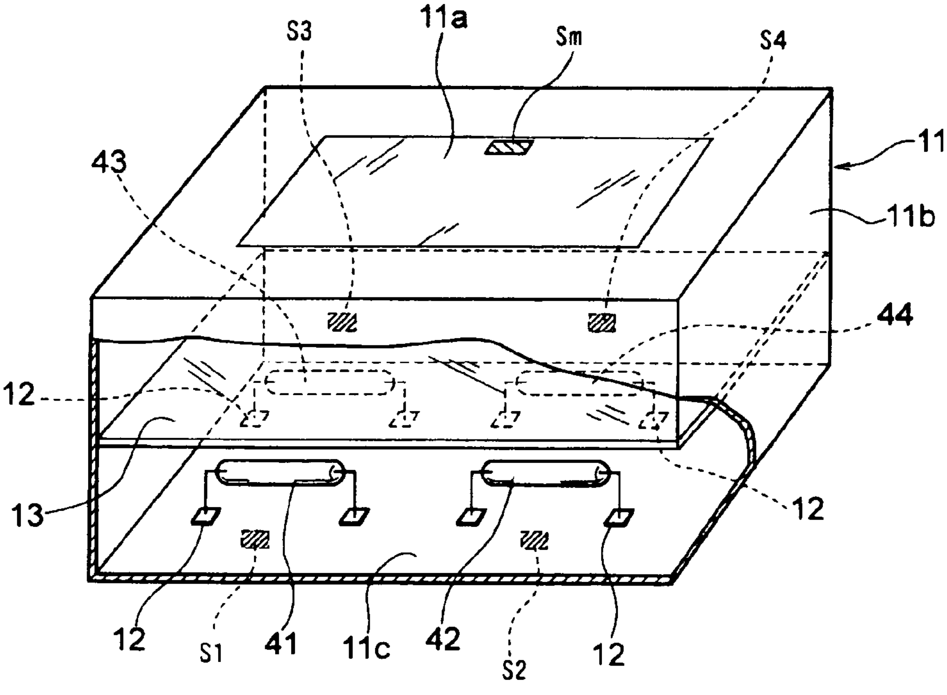
FIG. 5 is a schematic perspective view, partially cutaway view showing an enclosure of the solar simulator to explain an example 1 of a lamp arrangement of the solar simulator according to the present invention.
Figure 6:
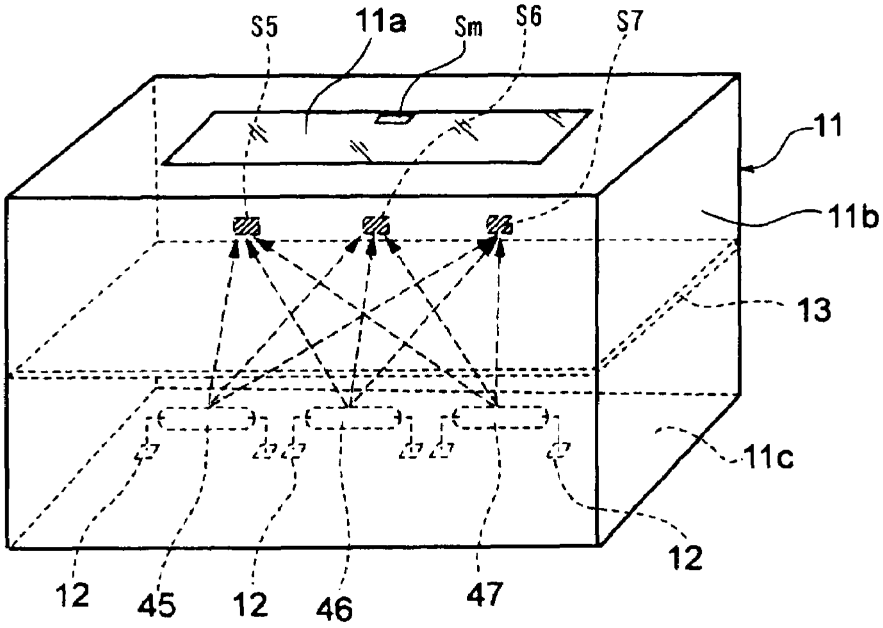
FIG. 6 is a schematic perspective view showing an example 2 of a lamp arrangement of the solar simulator according to the present invention.
Figure 7:
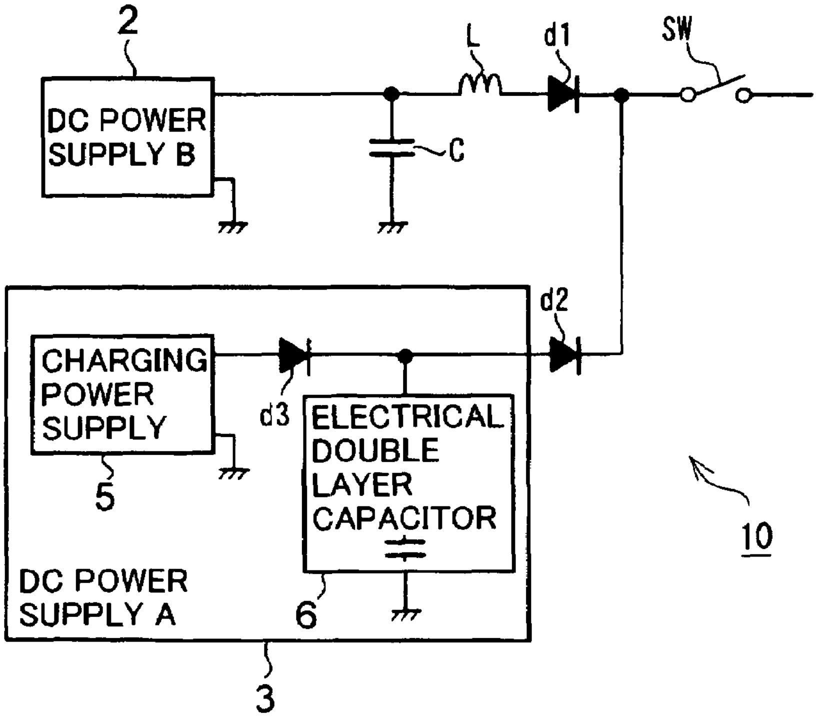
FIG. 7 is a diagram showing another exemplary structure of the lamp light emission power supply circuit.
Figure 8:
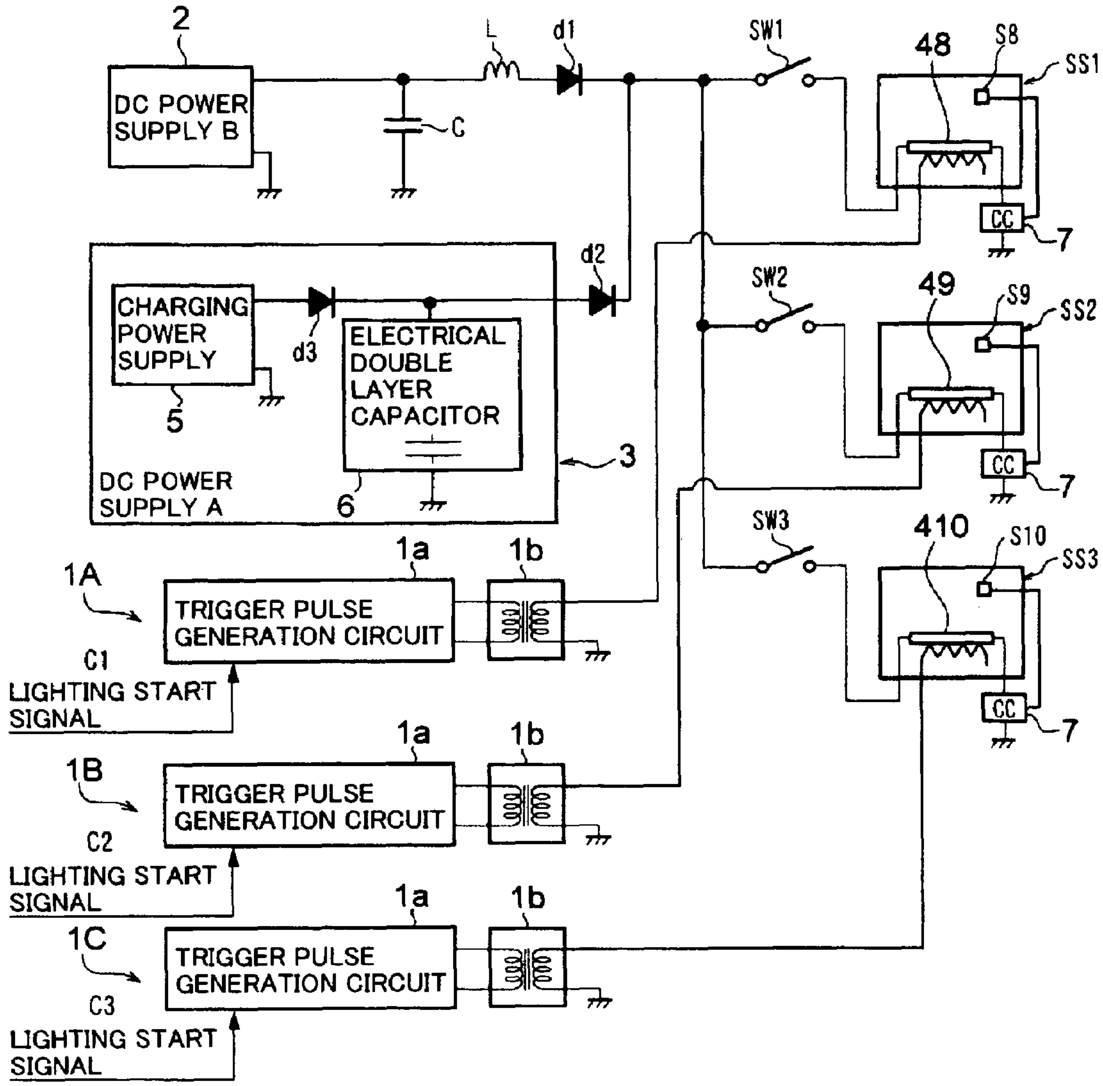
FIG. 8 is a block diagram explaining a method for driving the solar simulator according to the present invention.
Figure 9:
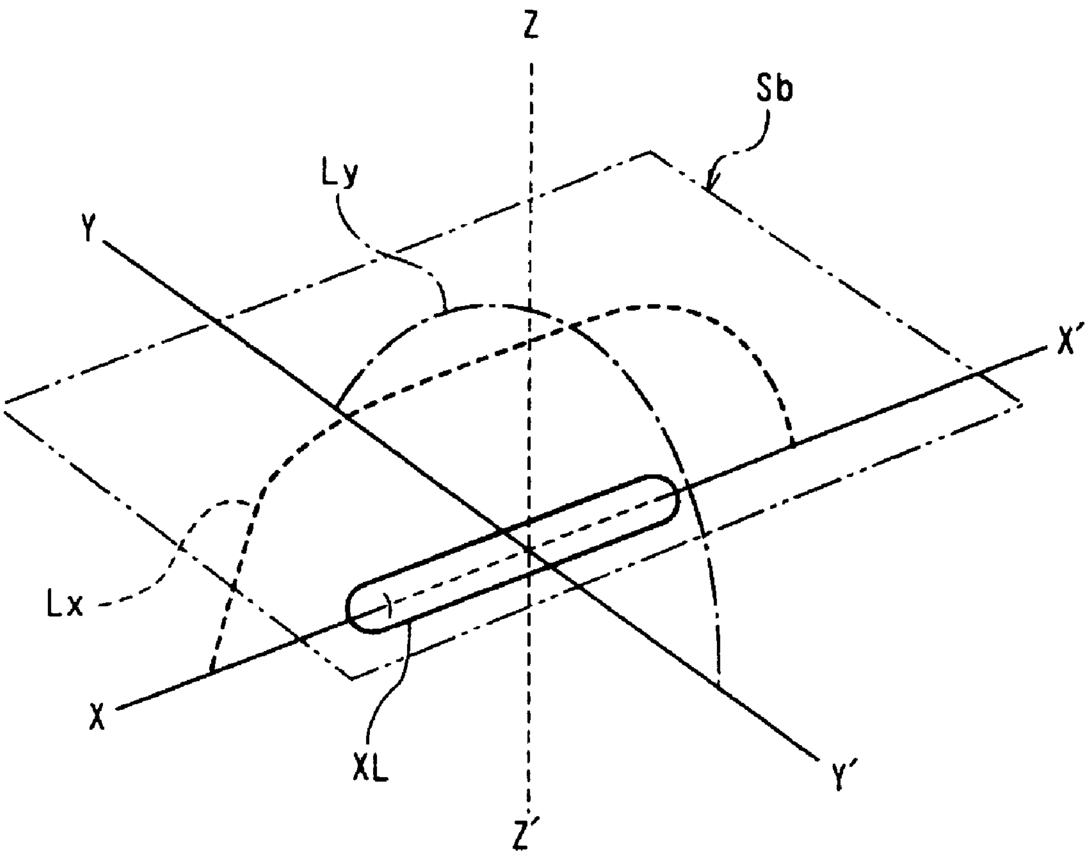
FIG. 9 is a schematic waveform diagram showing distribution of the light amount when lamp light emission is produced.

FIG. 1 is a block diagram explaining an embodiment 1 of a light emission circuit in a solar simulator according to the present invention. FIG. 2 is a diagram showing an exemplary structure of a lamp light emission power supply circuit. FIG. 3 is a block diagram explaining a major element of an embodiment 2 of the light emission circuit in the solar simulator according to the present invention. FIG. 4 is a block diagram explaining a major element of an embodiment 3 of the light emission circuit in the solar simulator according to the present invention. FIG. 5 is a perspective view schematically showing an example 1 of the lamp arrangement of the solar simulator according to the present invention. FIG. 6 is a perspective view schematically showing an example 2 of the lamp arrangement of the solar simulator according to the present invention. FIG. 7 is a diagram showing another structure of the lamp light emission power supply circuit. FIG. 8 is a block diagram explaining a method for driving a plurality of solar simulators according to the present invention.

Initially, the embodiment 1 of a light emission circuit in a solar simulator according to the present invention will be described while referring to FIG. 1.

In FIG. 1, reference numeral 1 refers to a first power supply having a trigger pulse generation circuit 1*a* on the primary side of the transformer 1*b* relative to a plurality of xenon arc lamps 41, 42 . . . 4*n* (hereinafter denoted as 41 through 4*n* with n being a natural number) for generating a voltage to cause initial insulation breakdown. Reference numeral 10 refers to a lamp light emission power supply circuit for causing the lamps 41 through 4*n* to emit light.

In FIG. 1, a single lamp light power supply circuit 10 is used to produce light emission from the plurality of lamps 41 through 4*n*. Alternatively, a lamp light emission power supply circuit 10 may be provided for every lamp. A current control circuit 7 is mounted to each of the lamps 41 through 41*n*, for stabilizing the amount of light emitted therefrom. It should be noted that the current control circuit 7 is not limited to any particular circuit, and any known circuit can be employed to serve as the current control circuit 7.

As the xenon arc lamps 41 through 4*n* shown, any xenon arc lamp is applicable as long as the lamp has a structure in which the discharge electrodes are situated apart from each other by a distance equal to or longer than 100 mm and an electrical potential to destroy the electrically insulated state held between the electrodes 4*a* and 4*b* can be applied from the outside of the glass tube.

Figure 2A:
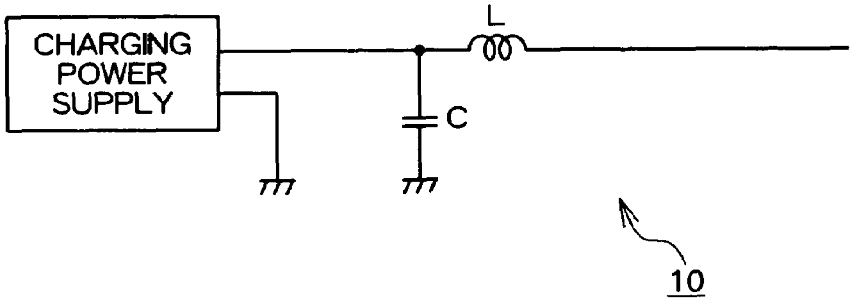
FIG. 2 is a diagram showing an exemplary structure of a lamp light emission power supply circuit.
Figure 2B:
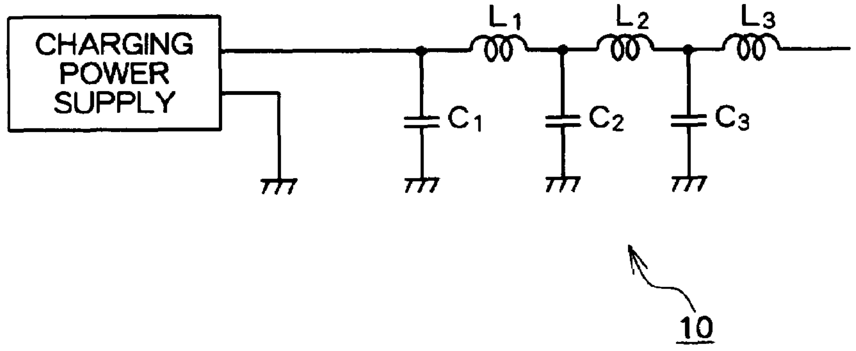

As the lamp light emission power supply circuit 10, a known lamp light emission power supply circuit, such as is shown in FIGS. 2A and 2B, can be used as one example. It should be noted that, in FIGS. 2A and 2B, L, L1, L2, L3 . . . refer to coils and C, C1, C2, C3 . . . refer to capacitors. A charging power supply is a DC power supply circuit. The circuit shown in FIG. 2A is a circuit in which a period of time during which a pulse for causing light emission from a lamp is output is set to a certain value by utilizing a coil and a capacitor. FIG. 2B shows a circuit in which a period of time during which a pulse for causing light emission from a lamp is output is prolonged by utilizing a plurality of pairs of coils and a capacitors.

In this embodiment, as light emission is to be produced from a plurality of xenon arc lamps 41 through 4*n*, one of the wires on the secondary side of the transformer 1*b* in the first power supply 1 may be branched so as to correspond to the plurality of lamps 41 through 4*n*, as shown in FIG. 1. Alternatively, a plurality of first power supplies 1, each comprising the trigger pulse generation circuit 1*a* and the transformer 1*b*, may be provided, the number corresponding to the number of lamps arranged.

Further, in this embodiment, in order to monitor the amount of light emitted from each of the xenon arc lamps 41 through 4*n*, a light amount sensor S1 through Sn, which may be formed using a photovoltaic cell or the like, as one example, is mounted to each of the respective xenon arc lamps 41 through 4*n*, so that output signals from the sensors S1 through Sn are fed back to the relevant current control circuits 7 of the xenon arc lamps 41 through 4*n* as shown in FIG. 1 to perform control such that the constant amounts of light are emitted from the respective lamps 41 through 4*n*.

In the following, in connection with the embodiment 1 of the light emission circuit for the xenon arc lamps 41 through 4*n*, an operation thereof will be described.

Initially, in response to a manual operation by an operator of a solar simulator to press an activation button or the like, a charge start signal is applied to the capacitor C or capacitors C1 through C3 in the power supply circuit 10 shown in FIG. 2. Alternatively, in the case of an automatic operation such as automatic driving, the charge start signal may be applied from a control device such as a personal computer. After the elapse of a predetermined period of time after the charge begins, a lighting start signal 1*c* is automatically applied to the trigger pulse generation circuit 1*a* (a first power supply 1).

In response to the lighting start signal 1*c* applied to the trigger pulse generation circuit 1*a*, a trigger pulse of a few KV is applied from the secondary side of the output transformer 1*b* to the external periphery of the glass tube of each of the xenon arc lamps 41 through 4*n*. With the application of the trigger pulse, the electrically insulated state held between the opposing electrodes 4*a* and 4*b* inside each of the xenon arc lamps 41 through 4*n* is destroyed.

Thereafter, the lamp light emission power supply circuit 10 shown in FIG. 2 is activated, so that a discharge standby voltage of about 450 V is applied to between the electrodes 4*a* and 4*b* of each of the xenon arc lamps 41 through 4*n*. This process triggers main discharge inside each of the xenon arc lamps 41 through 4*n*, upon which the inside-tube resistance of each of the xenon arc lamps 4*l* through 4*n* drops sharply from a value larger than a few MΩ to a value lower than a few Ω (different depending on lamps). As a result, the lamp emits light and the light emission is maintained for a predetermined period of time which is determined depending on the combination of the coil and capacitor.

In the embodiment 2 of the light emission circuit according to the present invention, as shown in FIG. 3, the current control circuit 7 in each of the lamps 41 through 4*n* in FIG. 1 is replaced by a voltage control circuit 8. It should be noted that the current control circuit 7 may be provided on the anode side of the xenon arc lamps 41 through 4*n* as shown in FIG. 4.

While referring to FIGS. 5 and 6, an exemplary structure of a solar simulator according to the present invention in which a plurality of xenon arc lamps 41 through 4*n* emit light using the above-described light emission circuit will be described.

In FIG. 5, reference numeral 11 refers to an enclosure of a solar simulator according to the present invention, in which a light permeable measurement surface 11*a* is formed on the upper surface thereof where a light receiving surface of photovoltaic devices to be measured is mounted, and circumferential walls 11*b* and a base wall 11*c* are formed using light shading material. In the example shown, four xenon arc lamps 41 through 44 are mounted on the lamp receiving members 12 each including a socket and a wire, and all arranged equally on the base wall 11*c*.

Above the lamps 41 through 44, an optical filter 13 or the like is arranged so as to horizontally traverse the inside of the enclosure 11 such that the constant amount of light emitted from the lamps 41 through 44 irradiates the measurement surface 11*a* (namely, the test plane 11*a*) when the lamps 41 through 44 are turned on. As an example, photovoltaic devices of about 2 m×4 m may be placed on the measurement surface 11*a* and measured.

Here, in the inside of the enclosure 11, four light amount sensors S1 through S4 are arranged on the inside surfaces of the circumferential walls 11*b* so as to correspond to the respective lamps 41 through 44. Also, at a predetermined position on the measurement surface 11*a*, an irradiance measurement reference cell Sm according to a standard is mounted. A detection signal output from each of the sensors S1 through S4 is fed back to the current control circuit 7 or the voltage control circuit 8 of each of the lamps 41 through 44, so that control is performed such that a constant current or voltage is applied to each of the respective lamps 41 through 44 so that the lamps 41 through 44 can maintain constant irradiance.

FIG. 6 is a diagram showing another exemplary structure of a solar simulator according to the present invention, in which a plurality of xenon arc lamps 41 through 4*n* emit light using the above-described light emission circuit. The example here concerns a structure which is adaptable for use with photovoltaic devices which are long in the horizontal direction, having a size of 1 m×4 m, for example, or the like.

In FIG. 6, members identical to those of the solar simulator shown in FIG. 5 are given identical reference numerals.

In the example shown in FIG. 6, three xenon arc lamps 45 through 47 are arranged in series in the inside of the enclosure 11. Accordingly, the measurement surface 11*a* of the enclosure 11 has a shape corresponding to the light receiving surface of photovoltaic devices having a size of about 1 m×4 m. Moreover, three light amount sensors S5 through S7 are arranged above the filter 13 so as to correspond to the lamps 45 through 47.

Here, the sensors S5, S6, S7 receive not only the light emitted from the respectively corresponding lamps 45, 46, 47 but also the light emitted from other lamps. Therefore, a feedback signal which is created by weighting and combining the detection signals output from the three sensors S5 through S7 is fed to each of the current or voltage control circuits 7 or 8 of the lamps 45 through 47. For example, a signal Fs to be fed back to the current control circuit 7 or the voltage control circuit 8 of the xenon arc lamp 45 is obtained as Fs=α×(output signal from the light amount sensor S5)+β×(output signal from the light amount sensor S6)+γ×(output signal from the light amount sensor S7)

wherein, α, β, and 0 γ are weighting variables.

The lamps 46 and 47 also each receive a feedback signal created in the same manner as that for the signal Fs. A feedback signal created through the above-described weighting and combining is similarly applicable to the solar simulator shown in FIG. 5.

As a lamp light emission power supply circuit of a solar simulator, a lamp light emission power supply circuit according to the present invention shown in FIG. 7 may be used in the place of the structure shown in FIG. 2. In FIG. 7, reference numeral 2 refers to a DC power supply B (a second power supply) for generating a voltage to initiate discharge for main light emission (main discharge) from the lamps 41 through 4*n*. Reference numeral 3 refers to a DC power supply A (a third power supply) for generating a voltage to maintain the discharge with a target amount of light from the lamps 41 through 4*n*. The DC power supply A is constructed having, as main components, a capacitor 6 (an electrical double layer capacitor) and a charging power supply (a stabilizing power supply) 5 for charging the capacitor 6, and functions such that the electrical potential which is obtained based on the electrical resistance inside the tubes of the lamps 41 through 4*n* and the current value of the main discharge is maintained whereby the main discharge is maintained. SW refers to a switch provided between the output terminals of the DC power supplies A and B and one of the terminals of each of the xenon arc lamps 41 through 4*n*. That is, the DC power supplies A and B are connected via the switch SW in parallel to the lamps 41 through 4*n*.

While referring to FIGS. 1 and 7, the function of a solar simulator using the power supply circuit shown in FIG. 7 will be described.

Initially, a lighting start signal 1*c* is applied to the trigger pulse generation circuit 1*a* (the first power supply 1). The input of the lighting start signal 1*c* is achieved by a start signal which is output in response to a manual operation by the operator who operates the solar simulator to press an activation button or the like. Alternatively, in the case of an automatic operation such as an automatic driving, the start signal is output from a control device such as a personal computer.

It should be noted that the switch SW, which remains open, is initially closed, and, after the lighting start signal 1*c* is output, the lamp begins light emission, and a predetermined period of time (about 100 milliseconds to a few seconds) is passed, becomes open again.

When the lighting start signal 1*c* shown in FIG. 1 is applied to the trigger pulse generation circuit 1*a*, a trigger pulse of a few KV is applied from the secondary side of the output transformer 1*b* to the external periphery of each of the glass tube of the respective xenon arc lamps 41 through 4*n*. With the application of the trigger pulse, the electrically insulated state held between the opposing electrodes 4*a* and 4*b* in the inside each of the xenon arc lamps 41 through 4*n* is destroyed. Thereafter, the DC power supply B (the second power supply 2) of the lamp light emission power supply circuit 10 shown in FIG. 7 is activated, so that a discharge standby voltage of about 450 V is applied to between the electrodes 4*a* and 4*b* of each of the xenon arc lamps 41 through 4*n*.

This process triggers main discharge inside each of the tubes of the lamps 41 through 4*n*, upon which the inside-tube resistance of each of the xenon arc lamps 41 through 4*n* drops sharply from a value larger than a few MΩ to a value lower than a few Ω (different depending on lamps). Thereafter, the DC power supply A (the third power supply 3) is activated, upon which a discharge maintenance voltage of about 130 V is applied to between the electrodes 4*a* and 4*b* of each of the xenon arc lamps 41 through 4*n*.

With the above, the main discharge in the inside of each of the xenon arc lamps 41 through 4*n* is continued, so that emission of a predetermined amount of light is continuously produced for a predetermined period of time (about 100 milliseconds to a few seconds).

As long pulse light emission for a long period of time is now possible as described above, the output characteristic of large-scaled photovoltaic devices which is slow in response can be measured with high accuracy by producing light emission from a plurality of lamps. It should be noted that a structure is also applicable in which a single xenon arc lamp is connected to the lamp light emission power supply circuit 10 to produce long pulse light emission from the xenon arc lamp.

In addition, use of the power supply circuit (comprising the second and third power supplies) of the present invention, shown in FIG. 7 makes it possible to drive a plurality of solar simulators using a single power supply circuit. For example, it is possible to concurrently or selectively drive a plurality of solar simulators each having at least one xenon lamp. One example of the manner of driving is described below while referring to the schematic drawing of FIG. 8. In FIG. 8, identical members shown in FIGS. 1 through 7 are given identical reference numerals.

In the drawing, with respect to three solar simulators SS1 through SS3 each having a single xenon arc lamp 48, 49, 410, the first power supplies 1A, 1B, 1C are provided for the xenon arc lamps 48, 49, 410, respectively, and the output circuits of the second power supply 2 and the third power supply 3 are connected in parallel to the xenon arc lamps 48, 49, 410 via the switches SW1 through SW3. Therefore, when the lighting start signals C1 through C3 are concurrently input to the respective first power supplies 1A through 1C, the three xenon arc lamps 48, 49, 410 concurrently emit light.

As for the example shown in FIG. 8, an alternative structure (not shown) is also applicable in which a single first power supply 1 is provided with respect to the three lamps 48 through 410. In this structure, the xenon arc lamps 48, 49, 410 of the three solar simulators SS1 through SS3 concurrently emit light.

Meanwhile, as for the structure shown in FIG. 8, in which the first power supplies 1A through 1C are provided to the respective lamps, selective light emission, beside concurrent light emission, is also possible.

The embodiment of the present invention, which has been described above, is extremely useful as a solar simulator as it is possible to produce light emission from a plurality of lamps of a solar simulator using a single light emission circuit.

Specifically, the embodiment can present the advantages described below.

(1) As it is possible to produce light emission from a plurality of lamps of a solar simulator using a single light emission circuit, the output characteristic of large-scaled photovoltaic devices can be measured using a remarkably small and inexpensive power supply, compared to the conventional art.

(2) As it is possible to stably maintain the amount of light when light emission is continuously produced from a plurality of lamps of a solar simulator, the output characteristic of photovoltaic devices can be measured using the solar simulator with high accuracy.

(3) As it is possible to drive a plurality of solar simulators using a single power supply circuit which comprises the second and third power supplies, an area in which the device is installed can be reduced and power feeding equipment can be simplified.

Also, the use of a power supply circuit which comprises the second and third power supplies makes it possible to produce long pulse light emission from one or more xenon arc lamps, without enlarging the device.

The invention claimed is:

1. A solar simulator, comprising:

a plurality of xenon arc lamps;

a plurality of light amount sensors provided, one for each of the xenon arc lamps; and a plurality of control circuits provided, one for each of the xenon arc lamps, for controlling a current flowing through, or a voltage applied to, each of the xenon arc lamps, wherein a detection signal output from each of the light amount sensors is weighted, combined to the others and then fed to each of the control circuits to control the relevant control circuit, to thereby control an amount of light emitted from each of the xenon arc lamps.

2. A solar simulator having a light emission circuit for concurrently or selectively lighting one or more xenon arc lamps, wherein the light emission circuit comprises a first power supply for applying electrical potential to destroy an electrically insulated state held between electrodes of each of the xenon arc lamps, a second power supply for applying electrical potential to trigger main discharge after application of the electrical potential to destroy the electrically insulated state held between electrodes of each of the xenon arc lamps, and a third power supply for maintaining the electrical potential required based on electrical resistance within a tube inside each of the xenon arc lamps and a current for main discharge after the main discharge begins, and further maintaining the current of the main discharge.

3. The solar simulator according to claim 2, wherein the third power supply includes a stabilizing power supply.

4. The solar simulator according to claim 3, wherein the third power supply includes a capacitor which is charged by the stabilizing power supply.

5. The solar simulator according to claim 2, wherein a light amount sensor is provided for each of the one or more xenon arc lamps, and a detection signal output from each of the light amount sensors is fed back to a current control circuit or a voltage control circuit provided one for each of the xenon arc lamps to control the control circuit, whereby an amount of light emitted from each of the xenon arc lamps is controlled.

6. The solar simulator according to claim 5, wherein the detection signal output from each of the light amount sensors is weighted and combined before being fed to each of the control circuits.

7. A method for driving a solar simulator, comprising controlling light emission produced from each of a plurality of xenon lamps of a plurality of solar simulators each having at least one xenon lamp, the light emission being produced using a power supply circuit comprising a first power supply for applying electrical potential to trigger main discharge after application of an electrical potential to destroy an electrically insulated state held between electrodes of each of the at least one xenon lamps, and a second power supply for maintaining the electrical potential required based on electrical resistance within a tube inside each of the at least one xenon lamps and a current for main discharge after the main discharge begins, and further maintaining the current of the main discharge, to thereby drive the plurality of solar simulators.

* * * * *